(12) United States Patent
Frey et al.

(10) Patent No.: US 7,235,447 B2
(45) Date of Patent: Jun. 26, 2007

(54) FABRICATION METHOD FOR A SEMICONDUCTOR STRUCTURE AND CORRESPONDING SEMICONDUCTOR STRUCTURE

(75) Inventors: Ulrich Frey, Dresden (DE); Matthias Goldbach, Dresden (DE); Dirk Offenberg, Kleve-Kellen (DE)

(73) Assignee: Infineon Technologies AG, Munich (DE)

( * ) Notice: Subject to any disclaimer, the term of this patent is extended or adjusted under 35 U.S.C. 154(b) by 232 days.

(21) Appl. No.: 11/035,705

(22) Filed: Jan. 14, 2005

(65) Prior Publication Data

US 2005/0173729 A1 Aug. 11, 2005

(30) Foreign Application Priority Data

Feb. 6, 2004 (DE) .................. 10 2004 005 992

(51) Int. Cl.
*H01L 21/8234* (2006.01)
(52) U.S. Cl. ................... 438/275; 438/595; 257/E21.64
(58) Field of Classification Search ............... 438/213, 438/265, 275, 595; 257/E21.64
See application file for complete search history.

(56) References Cited

U.S. PATENT DOCUMENTS

| | | | |
|---|---|---|---|
| 5,202,277 A | 4/1993 | Kameyama et al. | |
| 6,127,711 A | 10/2000 | Ono | |
| 6,521,963 B1 | 2/2003 | Ota et al. | |
| 6,548,862 B2 * | 4/2003 | Ryu et al. | 257/331 |
| 6,613,624 B2 * | 9/2003 | Wurzer | 438/275 |
| 2003/0017686 A1 | 1/2003 | Wada | |
| 2003/0141554 A1 | 7/2003 | Uehara et al. | |

\* cited by examiner

*Primary Examiner*—Chandra Chaudhari
(74) *Attorney, Agent, or Firm*—Jenkins, Wilson, Taylor & Hunt, P.A.

(57) ABSTRACT

The present invention provides a fabrication method for a semiconductor structure and a corresponding semiconductor structure. The fabrication method comprises the following steps:
provision of a semiconductor substrate (1) with a gate dielectric (5); provision of a plurality of multilayered, elongate gate stacks (GS1; GS2) which essentially run parallel to one another on the gate dielectric (5), which gate stacks have a bottommost layer (10) made of silicon; provision of a first liner layer (60) made of a first material over the gate stacks (GS1; GS2) and the gate dielectric (5) uncovered beside the latter, the thickness (h) of which liner layer is less than a thickness (h') of the bottommost layer (10) made of silicon; provision of sidewall spacers (70) made of a second material on the vertical sidewalls of the gate stacks (GS1; GS2) over the first liner layer (60), a region of the first liner layer (60) over the gate dielectric (5) between the gate stacks (GS1; GS2) remaining free; selective removal of the first liner layer (60) with respect to the sidewall spacers (70) for the purpose of laterally uncovering the bottommost layer (10) made of silicon of the gate stacks (GS1; GS2); and selective oxidation of the uncovered bottommost layer (10) for the purpose of forming sidewall oxide regions (50') on the gate stacks (GS1; GS2).

7 Claims, 4 Drawing Sheets

FABRICATION METHOD FOR A SEMICONDUCTOR STRUCTURE AND CORRESPONDING SEMICONDUCTOR STRUCTURE

TECHNICAL FIELD

The present invention relates to a fabrication method for a semiconductor structure and a corresponding semiconductor structure.

BACKGROUND ART

Although applicable in principle to any desired integrated circuits, the present invention and the problem area on which it is based are explained with regard to integrated memory circuits using silicon technology.

FIGS. 2a–c show schematic illustrations of successive method stages of a method for fabricating a semiconductor structure in order to illustrate the problem area according to the invention.

In FIG. 2a, reference symbol 1 designates a silicon semiconductor substrate into which elements (not illustrated in any specific detail) of a semiconductor memory circuit are integrated. Reference symbol 5 is a gate dielectric layer made of silicon oxide. Over the gate dielectric 5, provision is made of a layer sequence made of a bottommost layer 10 made of polysilicon, a second from bottom layer 15 made of WN, a third from bottom layer 20 made of W and a topmost layer made of silicon nitride.

Partly finished elongate, essentially parallel gate stacks GS1, GS2 have been etched into the layer sequence by means of a customary etching method. In this case, the bottommost layer 10 has been thinned merely to a reduced thickness h" in comparison with its original thickness h'. In other words, the gate stacks GS1, GS2 have not yet been completely separated from one another in the process state shown in FIG. 2a. In the example shown, the thickness h" is approximately half as large as the thickness h'.

In a subsequent process step, illustrated in FIG. 2b, sidewall spacers 30 made of silicon nitride are formed on the vertical sidewalls of the semifinished gate stacks GS1, GS2, said sidewall spacers typically having a thickness of 5 nm in 90 nm technology.

After the process state shown in FIG. 2b, the structure is etched anisotropically using the sidewall spacers 30 as a mask, the polysilicon that is uncovered between the semifinished gate stacks GS1, GS2 above the dielectric 5 being removed in order to completely separate the gate stacks GS1, GS2.

In a further method step, the uncovered lateral surface of the bottommost layer 10 made of polysilicon is then selectively oxidized in order to create sidewall oxide regions 50 as insulation there.

What is problematic about the semiconductor structure described with reference to FIGS. 2a–c is that the layers 15, 20 made of WN and W, respectively, on the one hand have a high contact resistance with respect to the layer 10 made of polysilicon and word line/bit line short circuits often occur.

The high contact resistance stems from an inadequate protection from oxygen diffusion through the thin spacers, and the word line/bit line short circuits stem from the fact that the polysilicon 10 of the bottommost layer 10 projects laterally outward below the spacers 30 and, therefore, only a very thin insulation made of the sidewall oxide region 50 is present there.

SUMMARY OF THE INVENTION

Therefore, it is an object of the present invention to provide a fabrication method for a semiconductor structure and a corresponding semiconductor structure in which the above encapsulation problems are eliminated.

According to the invention, this problem is solved by means of the fabrication method specified in claim 1 and by means of the semiconductor structure specified in claim 8.

The advantages of the method according to the invention and of the semiconductor structure according to the invention reside in particular in the fact that an effective encapsulation is achieved.

Advantageous developments and improvements of the respective subject-matter of the invention are found in the subclaims.

In accordance with one preferred development, after the selective oxidation, a third liner layer made of the first or second material is provided over the gate stacks and the gate dielectric uncovered beside the latter.

In accordance with a further preferred development, the second material is silicon oxide or doped polysilicon.

In accordance with a further preferred development, the gate stacks have a second from bottom layer made of WN, a third from bottom layer made of W and a topmost layer made of silicon nitride.

In accordance with a further preferred development, the first material is silicon nitride.

In accordance with a further preferred development, the selective removal is effected by means of a wet etching.

In accordance with a further preferred development, the sidewall oxide regions on the gate stacks are not in contact with the second from bottom layer made of WN.

An exemplary embodiment of the invention is illustrated in the drawings and is explained in more detail in the description below.

DETAILED DESCRIPTION OF THE INVENTION

In the figures, identical reference symbols designate identical or functionally identical constituent parts.

FIGS. 1a–e show schematic illustrations of successive method stages of a method for fabricating a semiconductor structure as an embodiment of the present invention.

Figure 1A:
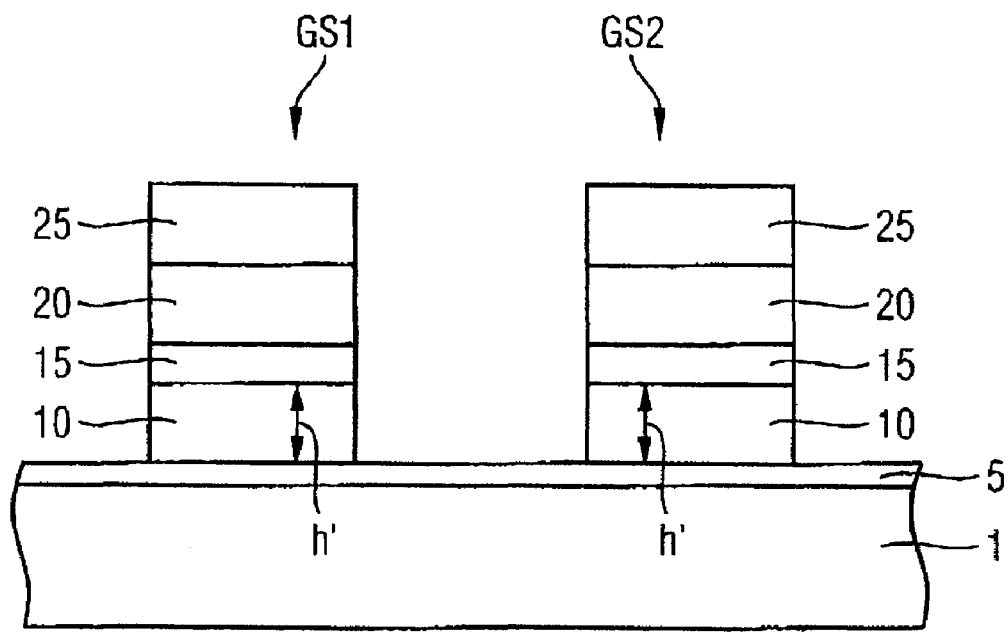
FIGS. 1a–e show schematic illustrations of successive method stages of a method for fabricating a semiconductor structure as an embodiment of the present invention.
Figure 2A:
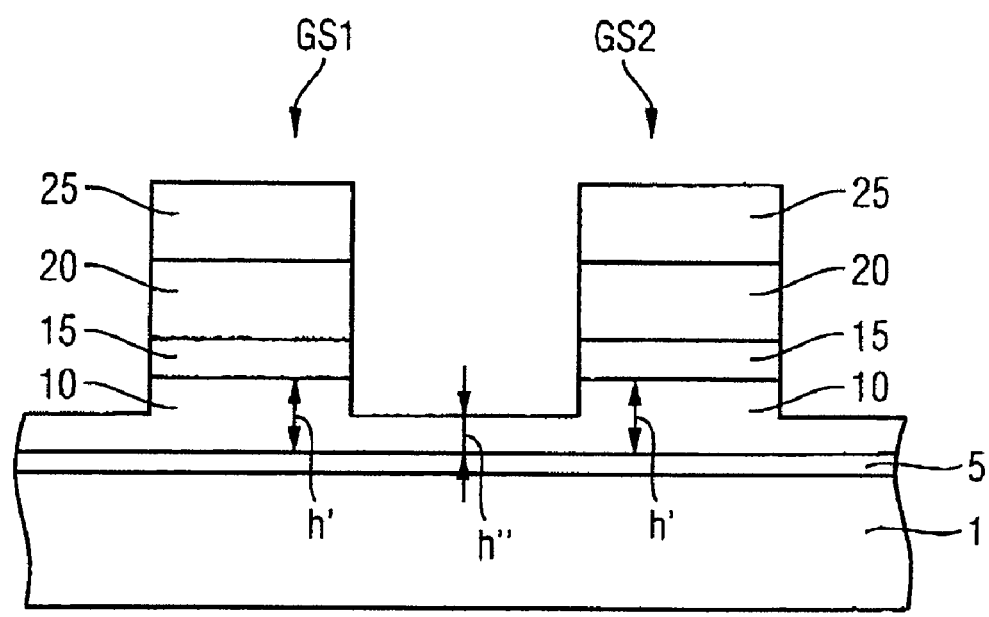
FIGS. 2a–c show schematic illustrations of successive method stages of a method for fabricating a semiconductor structure in order to illustrate the problem area according to the invention.

The process state in accordance with FIG. 1a corresponds to the process state in accordance with FIG. 2a, with the exception that the gate stacks GS1, GS2 have already been completely separated from one another. In other words, the layer etching for separating the gate stacks GS1, GS2 has been continued until reaching the surface of the gate dielectric 5. Consequently, in accordance with FIG. 1a, a silicon semiconductor substrate 1 with an overlying dielectric is present on which a plurality of multilayered, elongate stacks GS1, GS2 which essentially run parallel to one another are provided, which gate stacks have a bottommost layer 10 made of polysilicon having a thickness h'.

Figure 1B:
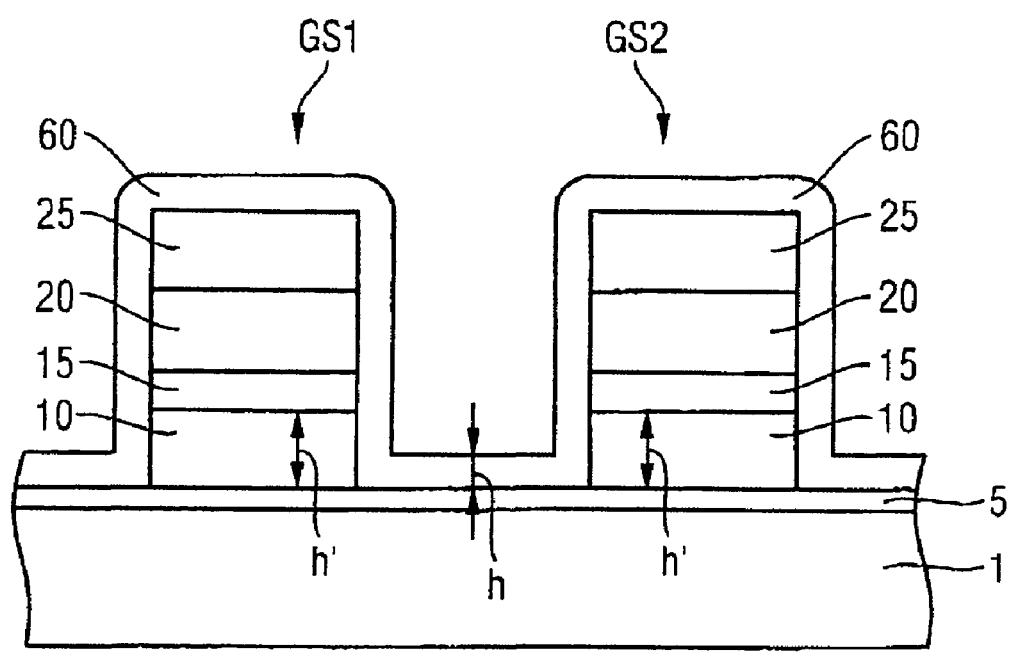
Figure 1C:
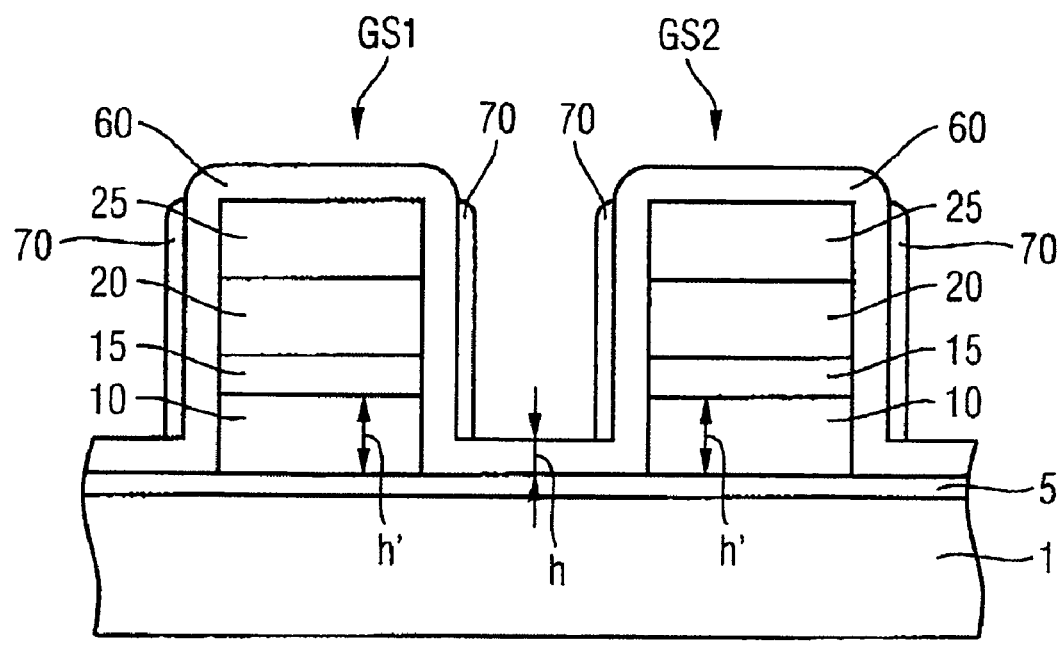

Furthermore referring to FIG. 1b, a liner layer made of silicon nitride and having a thickness of 10 nm is deposited over the resulting structure. This liner layer 60 made of silicon nitride has a thickness h that is less than the thickness h' of the bottommost layer 10 made of polysilicon, to be precise here by approximately 50%. Since the thickness h of the liner layer 60 is significantly smaller than the distance between adjacent gate stacks GS1, GS2, the liner layer 60 does not fill the interspace between the gate stacks GS1, GS2, but rather runs along the contours.

Afterward, a further liner layer made of silicon oxide, e.g. TEOS, is deposited over the resulting structure, said further liner layer having a thickness of typically 8 nm. The liner layer is etched by means of a known anisotropic spacer etching in order to provide sidewall spacers 70 made of silicon oxide over the first liner layer 60 on the vertical sidewalls of the gate stacks GS1, GS2, a region of the first liner layer 60 over the gate dielectric 5 between the gate stacks GS1, GS2 remaining free.

Figure 1D:
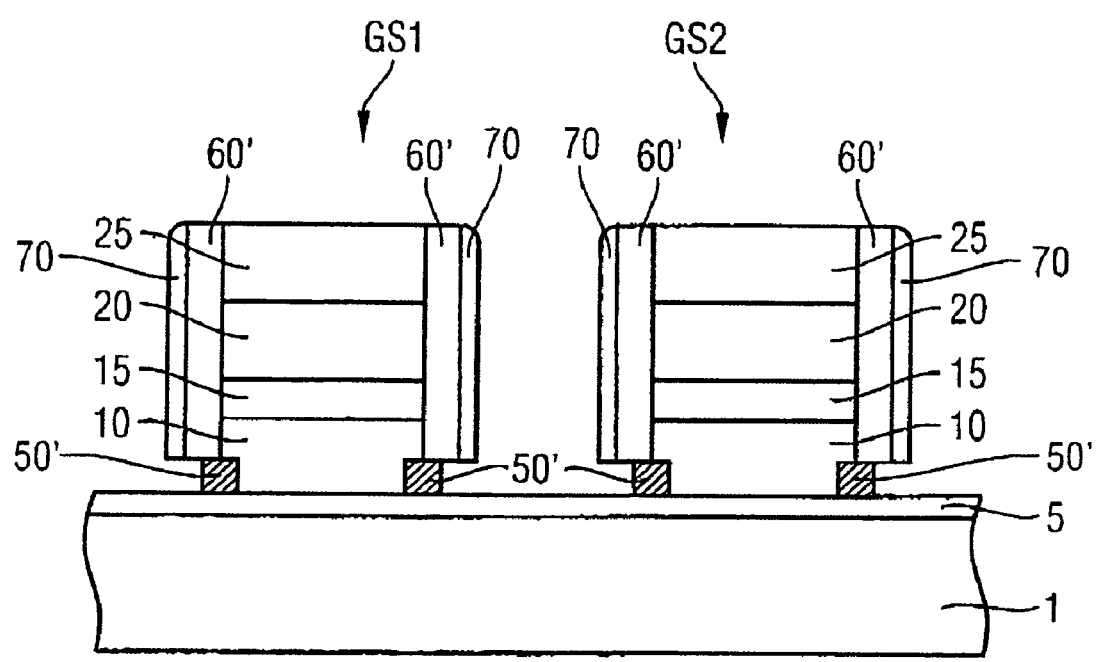
Figure 1E:
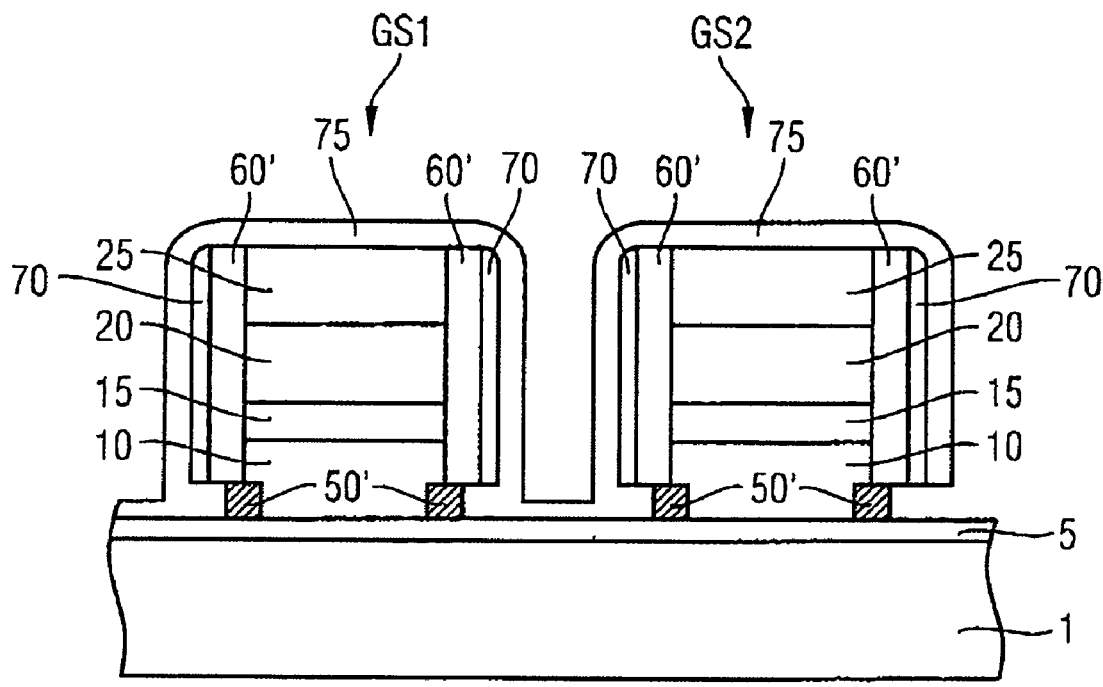

In a subsequent process step, illustrated in FIG. 1d, a selective wet etching is effected for the purpose of removing the first liner layer 60 from the horizontal surfaces, that is to say on the top side of the gate stacks GS1, GS2 and on the dielectric layer 5 between the gate stacks GS1, GS2. This etching is selective both with respect to the material of the dielectric 5 and with respect to the polysilicon of the bottommost layer 10. As soon as the bottommost layer 10 is laterally uncovered, the etching can be stopped.

Figure 2B:
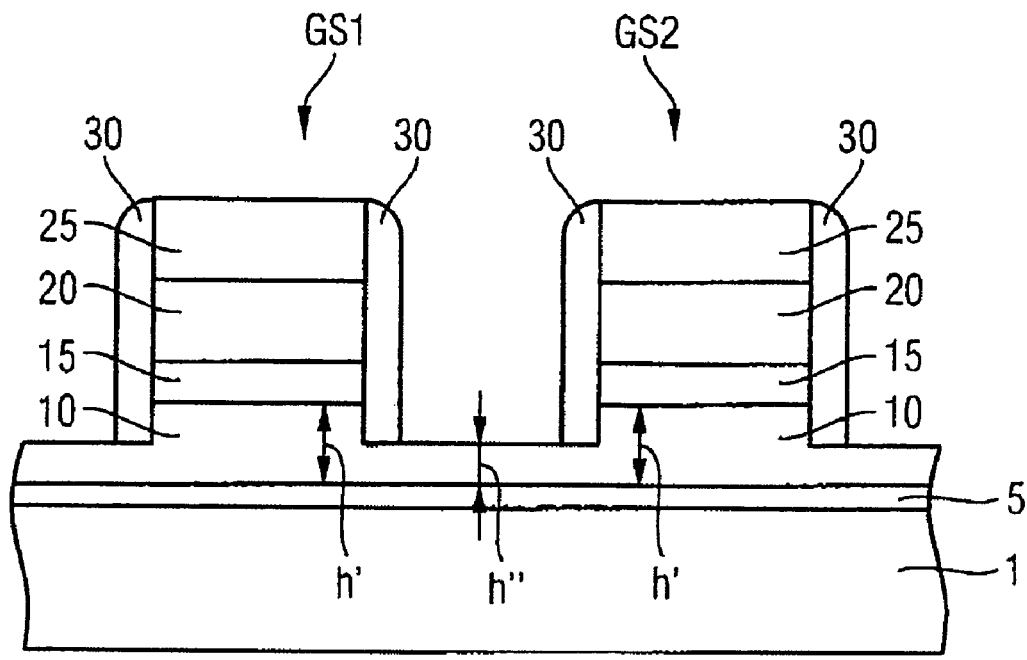
Figure 2C:
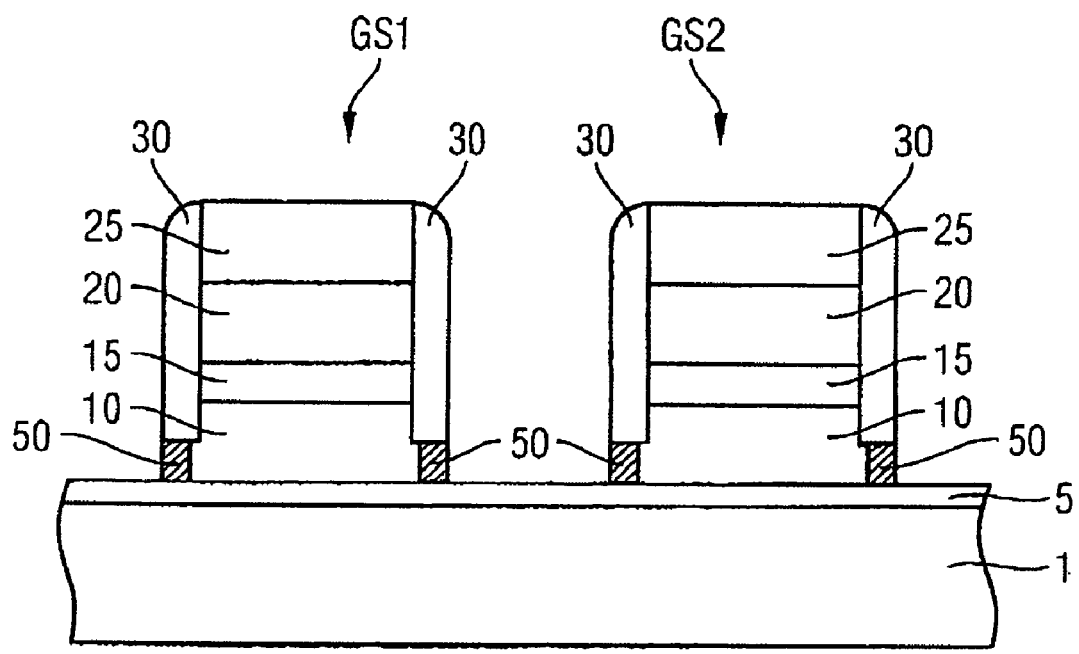

In a subsequent process step, the uncovered bottommost layer 10 is selectively oxidized for the purpose of forming sidewall oxide regions 50' on the underside of the gate stacks GS1, GS2. In contrast to the example illustrated in FIG. 2, here the bottommost layer 10 does not have any projections outward, but rather is drawn back somewhat through the sidewall oxide regions 50'.

Finally, a further liner layer 75 made of silicon oxide having a thickness of typically 8 nm is deposited over the resulting structure in order to close the structure under the sidewall spacers 60', 70.

During the selective etching process, sidewall spacers 60' are formed from the liner layer 60, said sidewall spacers being arranged essentially conformally with respect to the sidewall spacers 70.

The deposition of the liner layer 75 made of silicon oxide closes the coves under the spacers 60', 70 and results in a solid encapsulation of the gate stacks GS1, GS2 which is essentially insusceptible toward oxygen diffusion.

Although the present invention has been described above on the basis of a preferred exemplary embodiment, it is not restricted thereto, but rather can be modified in diverse ways.

In particular, the selection of the layer materials or filling materials is only by way of example and can be varied in many different ways.

LIST OF REFERENCE SYMBOLS

1 Semiconductor substrate
5 Gate dielectric
10 Polysilicon layer
15 WN layer
20 W layer
25 Silicon nitride layer
GS1, GS2 Gate stack
30, 60 SiN liner
H, h', h" Thickness
70 Silicon oxide spacer
60' Silicon nitride spacer
50, 50' Sidewall oxide regions
75 Silicon oxide liner

The invention claimed is:

1. Fabrication method for a semiconductor structure having the following steps:
   a) providing of a semiconductor substrate with a gate dielectric;
   b) providing of a plurality of multilayered, elongate gate stacks which essentially run parallel to one another on the gate dielectric, which gate stacks have a bottommost layer made of silicon;
   c) providing of a first liner layer made of a first material over the gate stacks and the gate dielectric uncovered over the latter, the thickness of which liner layer is less than a thickness of the bottommost layer made of silicon;
   d) providing of sidewall spacers made of a second material on the vertical sidewalls of the gate stacks over the first liner layer, a region of the first liner layer over the gate dielectric between the gate stacks remaining free;
   e) removing selectively of the first liner layer with respect to the sidewall spacers and the gate dielectric for the purpose of laterally uncovering the bottommost layer made of silicon of the gate stacks; and
   f) oxidizing selectively of the uncovered bottommost layer for the purpose of forming sidewall oxide regions on the gate stacks.

2. Method according to claim 1, wherein, after the selective oxidation, a third liner layer made of the first or second material is provided over the gate stacks and the gate dielectric uncovered beside the latter.

3. Method according to claim 1, wherein the second material is silicon oxide or doped polysilicon.

4. Method according to claim 1, wherein the gate stacks have a second from bottom layer made of WN, a third from bottom layer made of W and a topmost layer made of silicon nitride.

5. Method according to claim 1, wherein the first material is silicon nitride.

6. Method according to claim 1, wherein selective removal is effected by means of a wet etching.

7. Method according to claim 4, wherein the sidewall oxide regions on the gate stacks are not in contact with the second from bottom layer made of WN.

* * * * *